(12) United States Patent
Yagi

(10) Patent No.: US 7,740,959 B2
(45) Date of Patent: Jun. 22, 2010

(54) ORGANIC ELECTROLUMINESCENT DEVICE

(75) Inventor: Kazunari Yagi, Ashigarakami-gun (JP)

(73) Assignee: FUJIFILM Corporation, Tokyo (JP)

( * ) Notice: Subject to any disclaimer, the term of this patent is extended or adjusted under 35 U.S.C. 154(b) by 360 days.

(21) Appl. No.: 11/859,332

(22) Filed: Sep. 21, 2007

(65) Prior Publication Data

US 2008/0074040 A1   Mar. 27, 2008

(30) Foreign Application Priority Data

Sep. 27, 2006   (JP) .............................. 2006-263416

(51) Int. Cl.
*H01L 51/54* (2006.01)
(52) U.S. Cl. ...................... 428/690; 428/917; 313/504; 313/506
(58) Field of Classification Search ........................ None
See application file for complete search history.

(56) References Cited

U.S. PATENT DOCUMENTS 7,232,617 B2 * 6/2007 Lee et al. ..................... 428/690
2009/0243468 A1 * 10/2009 Thompson et al. ........... 313/504

FOREIGN PATENT DOCUMENTS

JP         2001-247859 A    9/2001
WO         2004016711 A     2/2004

* cited by examiner

*Primary Examiner*—Dawn L Garrett
(74) *Attorney, Agent, or Firm*—Sughrue Mion, PLLC

(57) ABSTRACT

An organic electroluminescent device comprises: a pair of electrodes; and at least one organic layer comprising a light-emitting layer, said at least one organic layer being between the electrodes, wherein at least one of said at least one organic layer comprises at least one kind of compound represented by formula [1]:

Formula [1]:

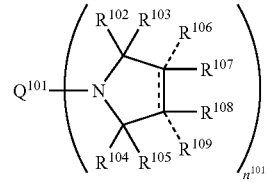

wherein $Q^{101}$ represents a linking group, the bond between the carbon atom bonded by $R^{107}$ and the carbon atom bonded by $R^{108}$ may be a single bond or a double bond (provided that when the bond between the carbon atom bonded by $R^{107}$ and the carbon atom bonded by $R^{108}$ is a double bond, $R^{106}$ and $R^{109}$ are not present), $R^{102}$ to $R^{105}$ each represents a substituent, $R^{106}$ to $R^{109}$ each represents a hydrogen atom or a substituent, $R^{107}$ and $R^{108}$ may combine to form a condensed ring, and $n^{101}$ represents an integer of 1 or more].

8 Claims, No Drawings

ORGANIC ELECTROLUMINESCENT DEVICE

BACKGROUND OF THE INVENTION

1. Field of the Invention

The present invention relates to a light-emitting device, particularly, an organic electroluminescent device (light-emitting device or EL device), which can emit light by converting electric energy into light.

2. Description of the Related Art

The organic electroluminescent device can emit high-brightness light with a low voltage and therefore, is attracting attention as a promising display device. An important characteristic value of this organic electro-luminescent device is a power consumption. The power consumption is represented by (voltage×current) and as the voltage value necessary for obtaining desired brightness and the current value are made smaller, the power consumption of the device can be more reduced.

As one attempt to decrease the current value flowing in the device, there is reported a light-emitting device utilizing luminescence from an ortho-metalated iridium complex (Ir(ppy)$_3$: tris-ortho-metalated complex of iridium(III) with 2-phenylpyridine) (see, for example, JP-A-2001-247859). The external quantum efficiency of the phosphorescent device described therein is greatly enhanced as compared with the related-art devices using singlet emission, and this leads to success in reducing the current value.

In regard to a blue phosphorescent device, there is reported a device using mCP (meta-N,N'-dicarbazolylbenzene) as the host material (see, for example, International Publication No. WO04/016711). However, the $T_1$ level (energy level in a lowest triplet excited state) of mCP is 66 kcal/mol and when this material is combined with a pure blue phosphorescent material which is a light-emitting material having a $T_1$ level in excess of 65 kcal/mol, non-radiation deactivation tends to occur, and improvement is demanded. Also, from the aspect of ionization potential, mCP has a large ionization potential value (Ip value) of 6.0 eV and tends to require a high device deriving voltage, and improvement is demanded.

SUMMARY OF THE INVENTION

An object of the present invention is to provide a light-emitting device assured of good efficiency (power consumption).

This object can be attained by the following means.

(1) An organic electroluminescent device comprising: a pair of electrodes; and at least one organic layer comprising a light-emitting layer, said at least one organic layer being between the electrodes, wherein at least one of said at least one organic layer comprises at least one kind of compound represented by formula [1]:

Formula [1]:

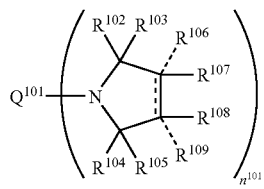

[wherein $Q^{101}$ represents a linking group, the bond between the carbon atom bonded by $R^{107}$ and the carbon atom bonded by $R^{108}$ may be a single bond or a double bond (provided that when the bond between the carbon atom bonded by $R^{107}$ and the carbon atom bonded by $R^{108}$ is a double bond, $R^{106}$ and $R^{109}$ are not present), $R^{102}$ to $R^{105}$ each represents a substituent, $R^{106}$ to $R^{109}$ each represents a hydrogen atom or a substituent, $R^{107}$ and $R^{108}$ may combine to form a condensed ring, and $n^{101}$ represents an integer of 1 or more].

(2) The organic electroluminescent device as described in (1), wherein the compound represented by formula [1] is a compound represented by formula [2]:

Formula [2]:

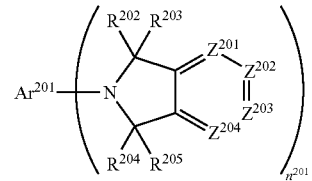

[wherein $Ar^{201}$ represents an aryl linking group or a heteroaryl linking group, $R^{202}$ to $R^{205}$ each represents a substituent, $Z^{201}$ to $Z^{204}$ each represents a nitrogen atom or a substituted or unsubstituted (the "unsubstituted" is defined as being substituted by a hydrogen atom) carbon atom, and $n^{201}$ represents an integer of 1 or more].

(3) The organic electroluminescent device as described in (1) or (2), wherein the compound represented by formula [1] is a compound represented by formula [3]:

Formula [3]:

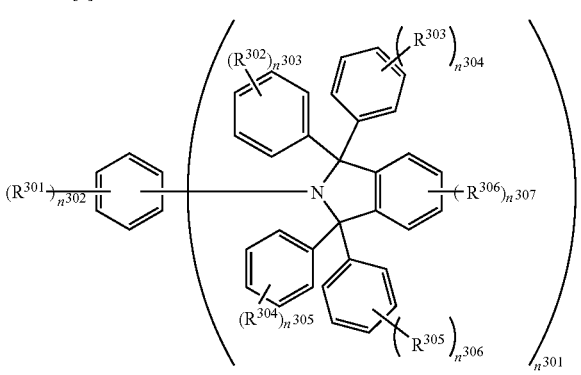

[wherein $R^{301}$ to $R^{306}$ each represents a substituent, $n^{301}$ represents an integer of 1 to 6, $n^{302}$ represents an integer of 0 to $(6-n^{301})$, $n^{303}$, $n^{304}$, $n^{305}$ and $n^{306}$ each represents an integer of 0 to 5, and $n^{307}$ represents an integer of 0 to 4].

(4) The organic electroluminescent device as described in any one of (1) to (3), wherein the light-emitting layer comprises at least one kind of a phosphorescent material.

(5) The organic electroluminescent device as described in any one of (1) to (4), wherein the light-emitting layer comprises the compound represented by any one of formulae [1] to [3].

(6) The organic electroluminescent device as described in any one of (1) to (5), wherein at least one of one or more layers adjacent to the light-emitting layer comprises the compound represented by any one of formulae [1] to [3].

(7) The organic electroluminescent device as described in any one of (1) to (6), further comprising an electron transport layer that contains a metal complex-based material.

(8) The organic electroluminescent device s described in any one of (1) to (7), wherein the light-emitting layer contains two or more kinds of host materials.

DETAILED DESCRIPTION OF THE INVENTION

Formula [1] is described below.

Formula [1]:

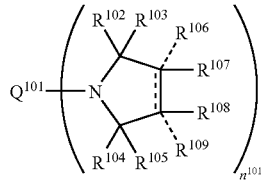

[wherein $Q^{101}$ represents a linking group, the bond between the carbon atom bonded by $R^{107}$ and the carbon atom bonded by $R^{108}$ may be a single bond or a double bond (provided that when the bond between the carbon atom bonded by $R^{107}$ and the carbon atom bonded by $R^{108}$ is a double bond, $R^{106}$ and $R^{109}$ are not present), $R^{102}$ to $R^{105}$ each represents a substituent, $R^{106}$ to $R^{109}$ each represents a hydrogen atom or a substituent, $R^{107}$ and $R^{108}$ may combine to form a condensed ring, and $n^{101}$ represents an integer of 1 or more].

$n^{101}$ represents an integer of 1 or more. $n^{101}$ is not particularly limited but is preferably an integer of 1 to 6, more preferably from 1 to 4, still more preferably 1 or 2.

$Q^{101}$ represents a linking group. The linking group is preferably an alkyl linking group, an aryl linking group (preferably an anthracene linking group, a naphthalene linking group or a benzene linking group, more preferably a benzene linking group), a heteroaryl linking group (preferably an aryl linking group containing a sulfur atom, an oxygen atom or a nitrogen atom, more preferably a nitrogen-containing aryl linking group, still more preferably a pyridine linking group), a silyl linking group, —O—, or —N<, more preferably an alkyl linking group, an aryl linking group, a heteroaryl linking group or a silyl linking group, still more preferably an aryl linking group or a heteroaryl linking group, yet still more preferably an aryl linking group. $Q^{101}$ may have a substituent (having the same meaning as the substituent described later for $R^{102}$ to $R^{109}$ in formula [1]).

$R^{102}$ to $R^{109}$ each represents a substituent (here, however, when the bond between the carbon atom bonded by $R^{107}$ and the carbon atom bonded by $R^{108}$ is a double bond, $R^{106}$ and $R^{109}$ are not present). At least two groups out of $R^{102}$ to $R^{109}$ may combine to form a condensed ring structure (e.g., benzo-condensed ring, pyrido-condensed ring).

The substituent is not particularly limited, but examples thereof include an alkyl group (preferably having a carbon number of 1 to 30, more preferably from 1 to 20, still more preferably from 1 to 10, e.g., methyl, ethyl, iso-propyl, tert-butyl, n-octyl, n-decyl, n-hexadecyl, cyclopropyl, cyclopentyl, cyclohexyl), an alkenyl group (preferably having a carbon number of 2 to 30, more preferably from 2 to 20, still more preferably from 2 to 10, e.g., vinyl, allyl, 2-butenyl, 3-pentenyl), an alkynyl group (preferably having a carbon number of 2 to 30, more preferably from 2 to 20, still more preferably from 2 to 10, e.g., propargyl, 3-pentynyl), an aryl group (preferably having a carbon number of 6 to 30, more preferably from 6 to 20, still more preferably from 6 to 12, e.g., phenyl, p-methylphenyl, naphthyl, anthranyl), an amino group (preferably having a carbon number of 0 to 30, more preferably from 0 to 20, still more preferably from 0 to 10, e.g., amino, methylamino, dimethylamino, diethylamino, dibenzylamino, diphenylamino, ditolylamino), an alkoxy group (preferably having a carbon number of 1 to 30, more preferably from 1 to 20, still more preferably from 1 to 10, e.g., methoxy, ethoxy, butoxy, 2-ethylhexyloxy), an aryloxy group (preferably having a carbon number of 6 to 30, more preferably from 6 to 20, still more preferably from 6 to 12, e.g., phenyloxy, 1-naphthyloxy, 2-naphthyloxy), a heterocyclic oxy group (preferably having a carbon number of 1 to 30, more preferably from 1 to 20, still more preferably from 1 to 12, e.g., pyridyloxy, pyrazyloxy, pyrimidyloxy, qunolyloxy), an acyl group (preferably having a carbon number of 1 to 30, more preferably from 1 to 20, still more preferably from 1 to 12, e.g., acetyl, benzoyl, formyl, pivaloyl), an alkoxycarbonyl group (preferably having a carbon number of 2 to 30, more preferably from 2 to 20, still more preferably from 2 to 12, e.g., methoxycarbonyl, ethoxycarbonyl), an aryloxycarbonyl group (preferably having a carbon number of 7 to 30, more preferably from 7 to 20, still more preferably from 7 to 12, e.g., phenyloxycarbonyl), an acyloxy group (preferably having a carbon number of 2 to 30, more preferably from 2 to 20, still more preferably from 2 to 10, e.g., acetoxy, benzoyloxy), an acylamino group (preferably having a carbon number of 2 to 30, more preferably from 2 to 20, still more preferably from 2 to 10, e.g., acetylamino, benzoylamino), an alkoxycarbonylamino group (preferably having a carbon number of 2 to 30, more preferably from 2 to 20, still more preferably from 2 to 12, e.g., methoxycarbonylamino), an aryloxycarbonylamino group (preferably having a carbon number of 7 to 30, more preferably from 7 to 20, still more preferably from 7 to 12, e.g., phenyloxycarbonylamino), a sulfonylamino group (preferably having a carbon number of 1 to 30, more preferably from 1 to 20, still more preferably from 1 to 12, e.g., methanesulfonylamino, benzenesulfonylamino), a sulfamoyl group (preferably having a carbon number of 0 to 30, more preferably from 0 to 20, still more preferably from 0 to 12, e.g., sulfamoyl, methylsulfamoyl, dimethylsulfamoyl, phenylsulfamoyl), a carbamoyl group (preferably having a carbon number of 1 to 30, more preferably from 1 to 20, still more preferably from 1 to 12, e.g., carbamoyl, methylcarbamoyl, diethylcarbamoyl, phenylcarbamoyl), an alkylthio group (preferably having a carbon number of 1 to 30, more preferably from 1 to 20, still more preferably from 1 to 12, e.g., methylthio, ethylthio), an arylthio group (preferably having a carbon number of 6 to 30, more preferably from 6 to 20, still more preferably from 6 to 12, e.g., phenylthio), a heterocyclic thio group (preferably having a carbon number of 1 to 30, more preferably from 1 to 20, still more preferably from 1 to 12, e.g., pyridylthio, 2-benzimidazolylthio, 2-benzoxazolylthio, 2-benzothiazolylthio), a sulfonyl group (preferably having a carbon number of 1 to 30, more preferably from 1 to 20, still more preferably from 1 to 12, e.g., mesyl, tosyl), a sulfinyl group (preferably having a carbon number of 1 to 30, more preferably from 1 to 20, still more preferably from 1 to 12, e.g., methanesulfinyl, benzenesulfinyl), a ureido group (preferably having a carbon number of 1 to 30, more preferably from 1 to 20, still more preferably from 1 to 12, e.g., ureido, methylureido, phenylureido), a phosphoric acid amido group (preferably having a carbon number of 1 to 30, more preferably from 1 to 20, still more preferably from 1 to 12, e.g., diethylphosphoric acid amido, phenylphosphoric acid amido), a hydroxy group, a mercapto group, a halogen atom (e.g., fluorine, chlorine, bromine, iodine), a cyano group, a sulfo group, a carboxyl group, a nitro group, a hydroxamic acid group, a sulfino group, a hydrazino group, an imino group, a heterocyclic group (preferably having a carbon number of 1 to 30, more preferably from 1 to 12; the heteroatom is, for example, nitrogen atom, oxygen atom or sulfur atom; e.g., imidazolyl, pyridyl, quinolyl, furyl, thienyl, piperidyl, morpholino, benzoxazolyl, benzimidazolyl, benzothiazolyl, carbazolyl, azepinyl), a silyl group (preferably having a carbon number of 3 to 40, more preferably from 3 to 30, still more preferably from 3 to 24, e.g., trimethylsilyl, triphenylsilyl), a silyloxy group (preferably having a carbon number of 3 to 40, more preferably from 3 to 30, still more preferably from 3 to 24, e.g., trimethylsilyloxy, triphenylsilyloxy), and a group after two substituents combine with each other to form a ring structure. The plurality of substituents may be the same or different.

$R^{102}$ to $R^{105}$ each is preferably a substituent bonded through a carbon atom, more preferably an alkyl group (preferably an alkyl group having a carbon number of 15 or less, more preferably an alkyl group having a carbon number of 6 or less, still more preferably a methyl group, an ethyl group, an isopropyl group or a tert-butyl group, yet still more preferably a methyl group), an aryl group (preferably an aryl group having a carbon number of 25 or less, more preferably an aryl group having a carbon number of 15 or less, still more preferably an aryl group having a carbon number of 10 or less, yet still more preferably a phenyl group), or a heteroaryl group bonded through a carbon atom (preferably a heteroaryl group having a carbon number of 10 or less, more preferably a heteroaryl group having a carbon number of 6 or less, still more preferably a nitrogen-containing heteroaryl group having a carbon number of 6 or less, yet still more preferably a pyridyl group), still more preferably an aryl group or an alkyl group, yet still more preferably an aryl group.

The bond between the carbon atom substituted by $R^{107}$ and the carbon atom substituted by $R^{108}$ is preferably a double bond (in this case, $R^{106}$ and $R^{109}$ are not present). $R^{106}$ to $R^{109}$ each is preferably a substituent bonded through a carbon atom. More preferably, $R^{107}$ and $R^{109}$ form a ring by combining with each other, and still more preferably, the ring formed by $R^{107}$ and $R^{108}$ is a condensed ring.

The compound represented formula [1] is preferably a compound represented by formula [2] or formula [3], more preferably a compound represented by formula [3].

Formula [2] is described below.

Formula [2]:

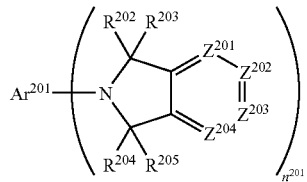

[wherein $Ar^{201}$ represents an aryl linking group or a heteroaryl linking group, $R^{202}$ to $R^{205}$ each represents a substituent, $Z^{201}$ to $Z^{204}$ each represents a nitrogen atom or a substituted or unsubstituted (the "unsubstituted" is defined as being substituted by a hydrogen atom) carbon atom, and $n^{201}$ represents an integer of 1 or more].

$n^{201}$ represents an integer of 1 or more. Although not particularly limited, $n^{201}$ is preferably an integer of 1 to 6, more preferably from 1 to 4, still more preferably 1 or 2.

$Ar^{201}$ represents an aryl linking group or a heteroaryl linking group.

The aryl linking group is preferably an aryl linking group having a carbon number of 6 to 30, more preferably from 6 to 20, still more preferably from 6 to 12, and examples thereof include a benzene ring, a naphthalene ring and anthracene ring. The heteroaryl linking group is preferably a heteroaryl linking group having a carbon number of 1 to 30, more preferably from 1 to 12, and the heteroatom contained in the heteroaryl group is preferably a nitrogen atom, an oxygen atom or a sulfur atom, more preferably a nitrogen atom or an oxygen atom, still more preferably a nitrogen atom. Specific examples of the heteroaryl linking group include an imidazole ring, a pyridine ring, a quinoline ring, a furan ring, a thiophene ring, a benzoxazole ring, a benzimidazole ring, a benzothiazole ring and a carbazole ring. Also, a substituent (having the same meaning as the substituent described above for $R^{102}$ to $R^{109}$ of formula [1]) may be bonded on the aryl linking group or heteroaryl linking group.

$Z^{201}$ to $Z^{204}$ each represents a nitrogen atom or a carbon atom substituted or unsubstituted by a substituent. Here, the substituent has the same meaning as the substituent described above for $R^{102}$ to $R^{109}$ of formula [1].

$R^{202}$ to $R^{205}$ each has the same meaning as the substituent described above for $R^{102}$ to $R^{105}$ of formula [1].

Formula [3] is described below.

Formula [3]:

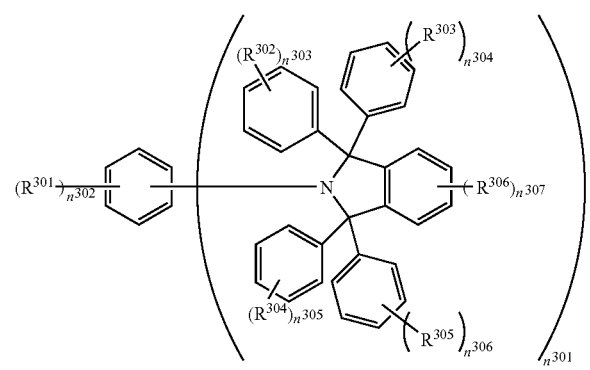

[wherein $R^{301}$ to $R^{306}$ each represents a substituent, $n^{301}$ represents an integer of 1 to 6, $n^{302}$ represents an integer of 0 to $(6-n^{301})$, $n^{303}$, $n^{304}$, $n^{305}$ and $n^{306}$ each represents an integer of 0 to 5, and $n^{307}$ represents an integer of 0 to 4].

$n^{301}$ represents an integer of 1 to 6, and $n^{302}$ represents an integer of 0 to $(6-n^{301})$. $n^{301}$ is preferably an integer of 1 to 3, more preferably 1 or 2, and $n^{302}$ is preferably an integer of 0 to 4, more preferably from 0 to 2.

$n^{303}$, $n^{304}$, $n^{305}$ and $n^{306}$ each represents an integer of 0 to 5. $n^{303}$, $n^{304}$, $n^{305}$ and $n^{306}$ each is preferably an integer of 0 to 4, more preferably 0 to 2.

$n^{307}$ represents an integer of 0 to 4.

$R^{301}$ to $R^{306}$ each represents a substituent, and the substituent has the same meaning as the substituent described above for $R^{102}$ to $R^{109}$ of formula [1]. Examples of the substituent represented by $R^{301}$ to $R^{306}$ include an alkyl group (preferably having a carbon number of 1 to 30, more preferably from 1 to 20, still more preferably from 1 to 10, e.g., methyl, ethyl, iso-propyl, tert-butyl, n-octyl, n-decyl, n-hexadecyl, cyclopropyl, cyclopentyl, cyclohexyl), an alkenyl group (preferably having a carbon number of 2 to 30, more preferably from 2 to 20, still more preferably from 2 to 10, e.g., vinyl, allyl, 2-butenyl, 3-pentenyl), an alkynyl group (preferably having a carbon number of 2 to 30, more preferably from 2 to 20, still more preferably from 2 to 10, e.g., propargyl, 3-pentynyl), an aryl group (preferably having a carbon number of 6 to 30, more preferably from 6 to 20, still more preferably from 6 to 12, e.g., phenyl, p-methylphenyl, naphthyl, anthranyl), an amino group (preferably having a carbon number of 0 to 30, more preferably from 0 to 20, still more preferably from 0 to 10, e.g., amino, methylamino, dimethylamino, diethylamino, dibenzylamino, diphenylamino, ditolylamino), an alkoxy group (preferably having a carbon number of 1 to 30, more preferably from 1 to 20, still more preferably from 1 to 10, e.g., methoxy, ethoxy, butoxy, 2-ethylhexyloxy), an aryloxy group (preferably having a carbon number of 6 to 30, more preferably from 6 to 20, still more preferably from 6 to 12, e.g., phenyloxy, 1-naphthyloxy, 2-naphthyloxy), a heterocyclic oxy group (preferably having a carbon number of 1 to 30, more preferably from 1 to 20, still more preferably from 1 to 12, e.g., pyridyloxy, pyrazyloxy, pyrimidyloxy, qunolyloxy), an acyl group (preferably having a carbon number of 1 to 30, more preferably from 1 to 20, still more preferably from 1 to 12, e.g., acetyl, benzoyl, formyl, pivaloyl), an alkoxycarbonyl group (preferably having a carbon number of 2 to 30, more preferably from 2 to 20, still more preferably from 2 to 12, e.g., methoxycarbonyl, ethoxycarbonyl), an aryloxycarbonyl group (preferably having a carbon number of 7 to 30, more preferably from 7 to 20, still more preferably from 7 to 12, e.g., phenyloxycarbonyl), an acyloxy group (preferably having a carbon number of 2 to 30, more preferably from 2 to 20, still more preferably from 2 to 10, e.g., acetoxy, benzoyloxy), an acylamino group (preferably having a carbon number of 2 to 30, more preferably from 2 to 20, still more preferably from 2 to 10, e.g., acetylamino, benzoylamino), an alkoxycarbonylamino group (preferably having a carbon number of 2 to 30, more preferably from 2 to 20, still more preferably from 2 to 12, e.g., methoxycarbonylamino), an aryloxycarbonylamino group (preferably having a carbon number of 7 to 30, more preferably from 7 to 20, still more preferably from 7 to 12, e.g., phenyloxycarbonylamino), a sulfonylamino group (preferably having a carbon number of 1 to 30, more preferably from 1 to 20, still more preferably from 1 to 12, e.g., methanesulfonylamino, benzenesulfonylamino), a sulfamoyl group (preferably having a carbon number of 0 to 30, more preferably from 0 to 20, still more preferably from 0 to 12, e.g., sulfamoyl, methylsulfamoyl, dimethylsulfamoyl, phenylsulfamoyl), a carbamoyl group (preferably having a carbon number of 1 to 30, more preferably from 1 to 20, still more preferably from 1 to 12, e.g., carbamoyl, methylcarbamoyl, diethylcarbamoyl, phenylcarbamoyl), an alkylthio group (preferably having a carbon number of 1 to 30, more preferably from 1 to 20, still more preferably from 1 to 12, e.g., methylthio, ethylthio), an arylthio group (preferably having a carbon number of 6 to 30, more preferably from 6 to 20, still more preferably from 6 to 12, e.g., phenylthio), a heterocyclic thio group (preferably having a carbon number of 1 to 30, more preferably from 1 to 20, still more preferably from 1 to 12, e.g., pyridylthio, 2-benzimidazolylthio, 2-benzoxazolylthio, 2-benzothiazolylthio), a sulfonyl group (preferably having a carbon number of 1 to 30, more preferably from 1 to 20, still more preferably from 1 to 12, e.g., mesyl, tosyl), a sulfinyl group (preferably having a carbon number of 1 to 30, more preferably from 1 to 20, still more preferably from 1 to 12, e.g., methanesulfinyl, benzenesulfinyl), a ureido group (preferably having a carbon number of 1 to 30, more preferably from 1 to 20, still more preferably from 1 to 12, e.g., ureido, methylureido, phenylureido), a phosphoric acid amido group (preferably having a carbon number of 1 to 30, more preferably from 1 to 20, still more preferably from 1 to 12, e.g., diethylphosphoric acid amido, phenylphosphoric acid amido), a hydroxy group, a mercapto group, a halogen atom (e.g., fluorine, chlorine, bromine, iodine), a cyano group, a sulfo group, a carboxyl group, a nitro group, a hydroxamic acid group, a sulfino group, a hydrazino group, an imino group, a heterocyclic group (preferably having a carbon number of 1 to 30, more preferably from 1 to 12; the heteroatom is, for example, nitrogen atom, oxygen atom or sulfur atom; e.g., imidazolyl, pyridyl, quinolyl, furyl, thienyl, piperidyl, morpholino, benzoxazolyl, benzimidazolyl, benzothiazolyl, carbazolyl, azepinyl), a silyl group (preferably having a carbon number of 3 to 40, more preferably from 3 to 30, still more preferably from 3 to 24, e.g., trimethylsilyl, triphenylsilyl), a silyloxy group (preferably having a carbon number of 3 to 40, more preferably from 3 to 30, still more preferably from 3 to 24, e.g., trimethylsilyloxy, triphenylsilyloxy), and a group after two substituents combine with each other to form a ring structure. The plurality of substituents may be the same or different.

The compounds represented by formulae [1] to [3] for use in the present invention may be a low molecular compound or an oligomer compound or may be a polymer having the structure represented by any one of formulae [1] to [3] in the main or side chain (the weight average molecular weight (in terms of polystyrene) is preferably from 1,000 to 5,000,000, more preferably from 2,000 to 1,000,000, still more preferably from 3,000 to 100,000). The compounds represented by formulae [1] to [3] are preferably a low molecular compound.

Examples of the compounds represented by formulae [1] to [3] are set forth below, but the present invention is not limited thereto.

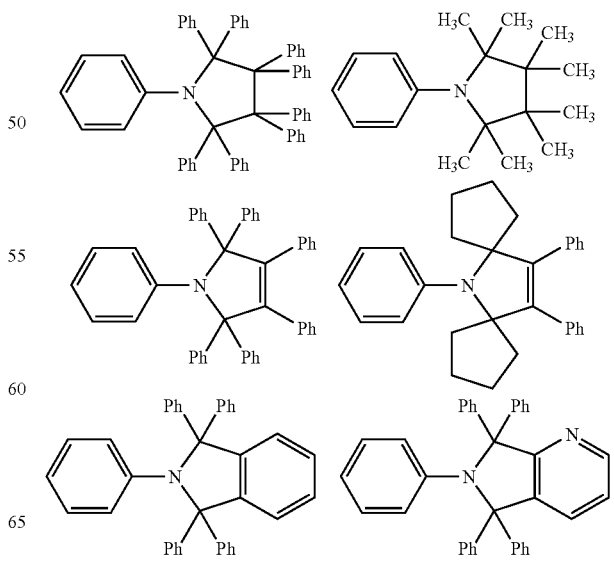

-continued
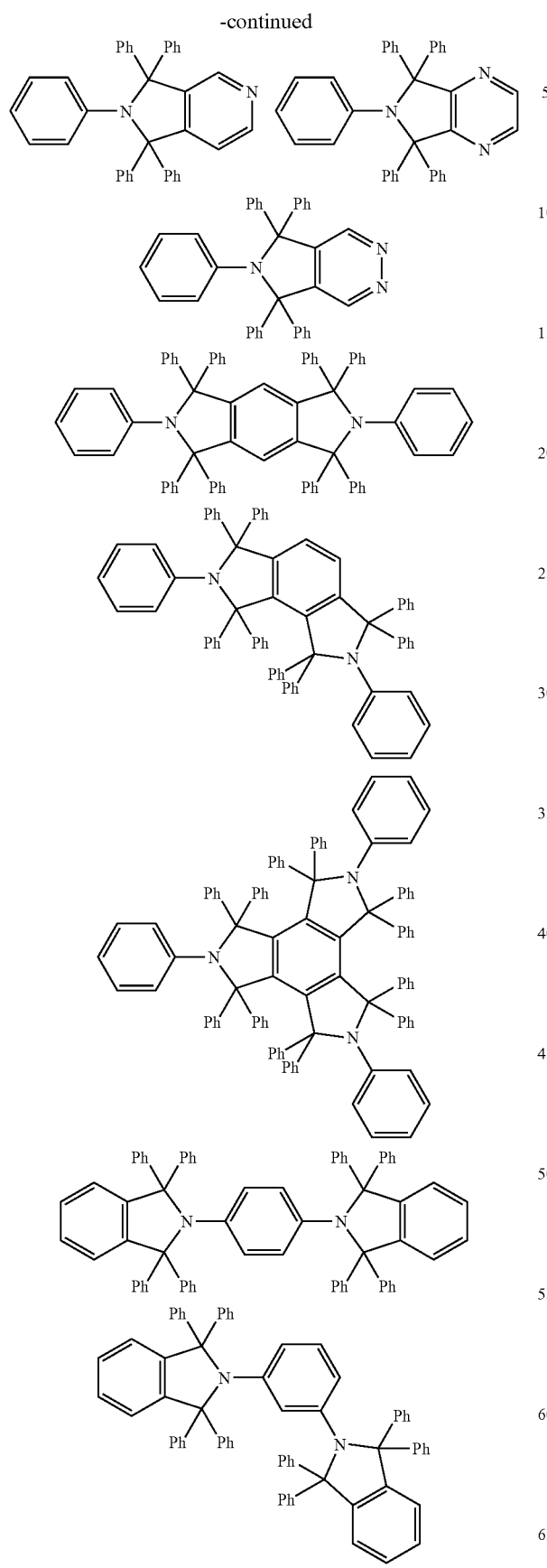
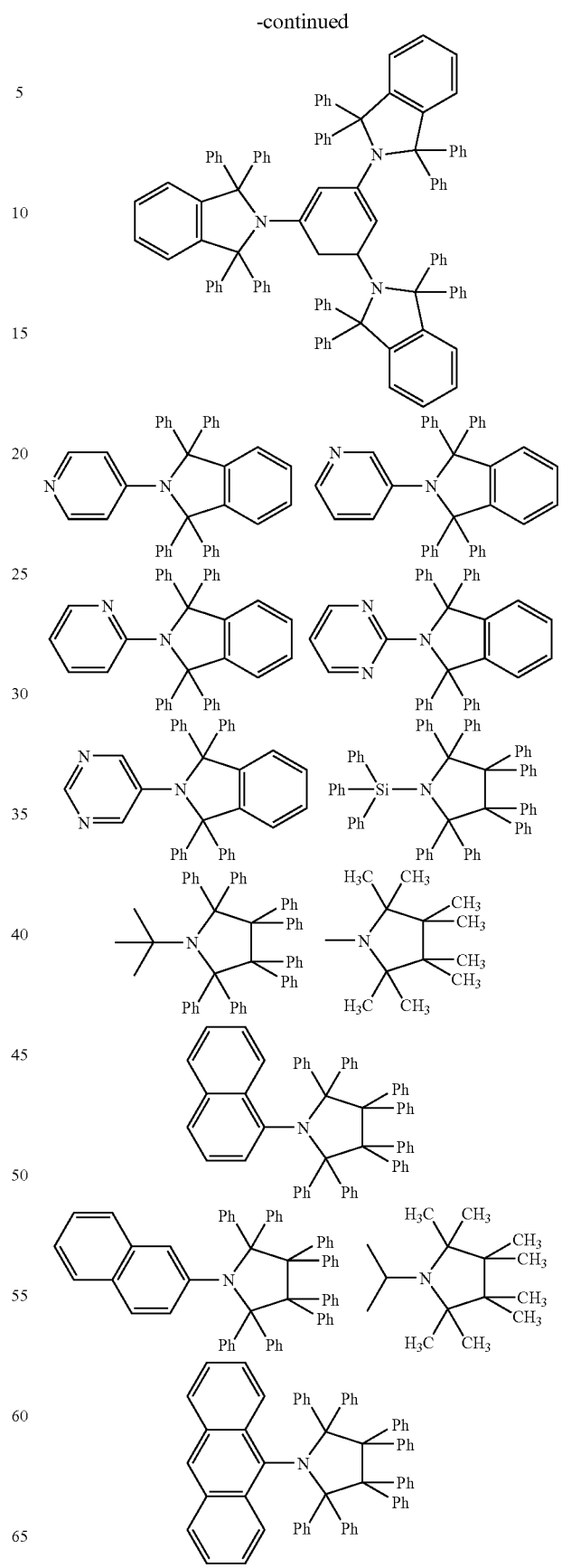

-continued
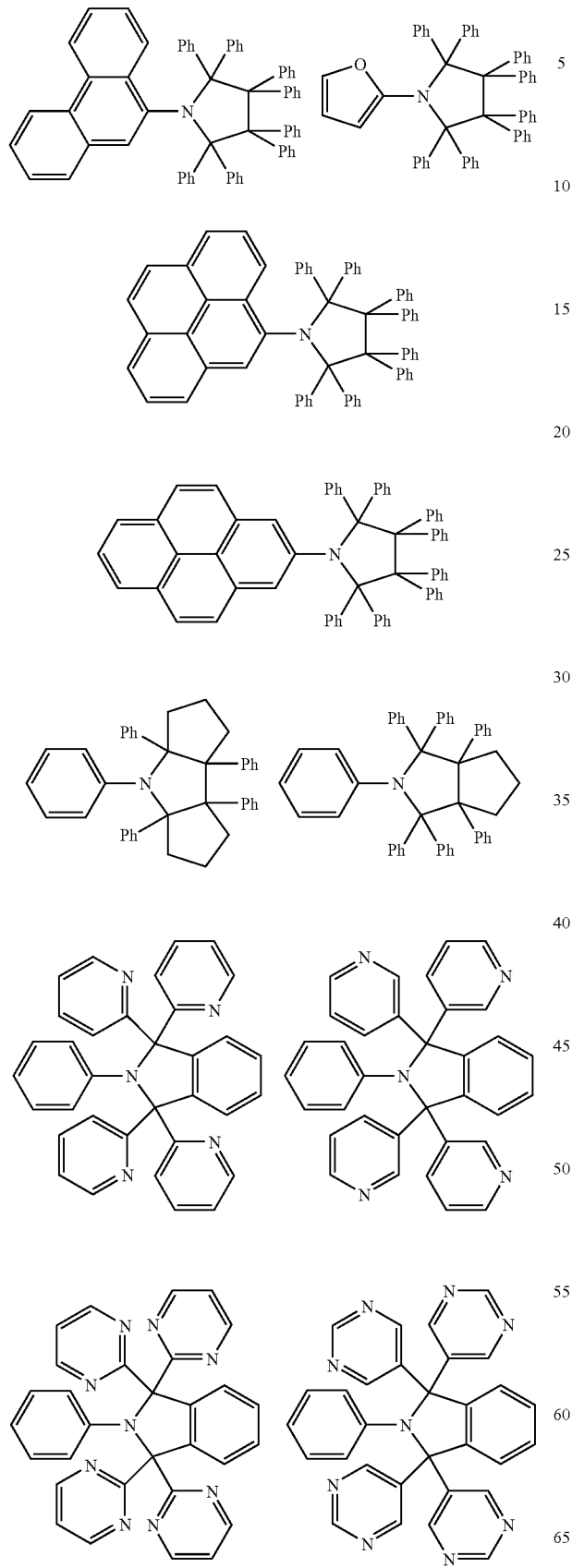
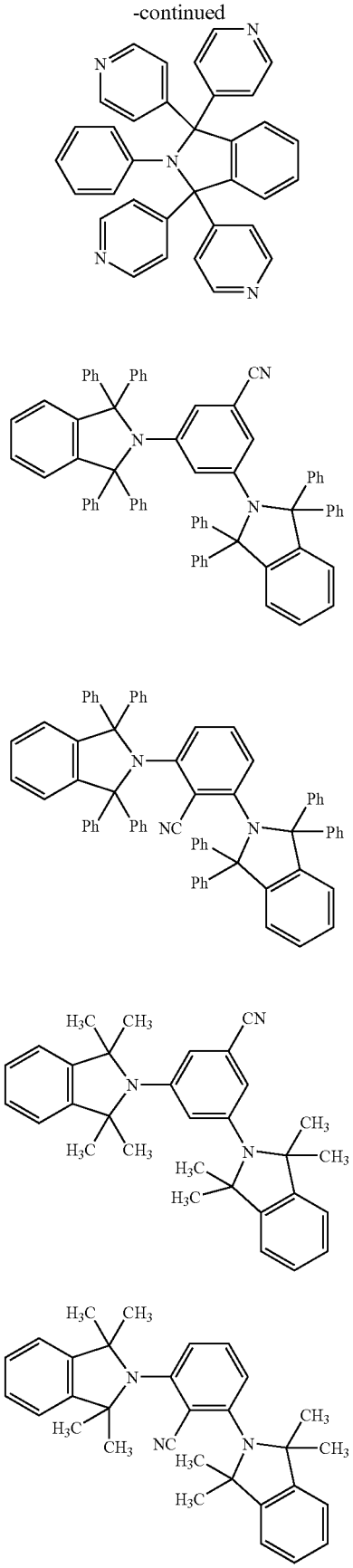

-continued
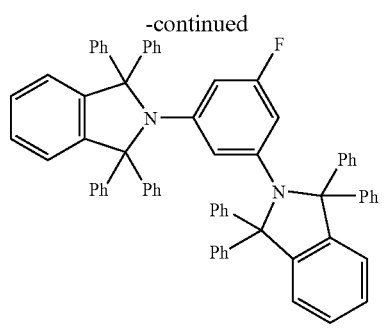
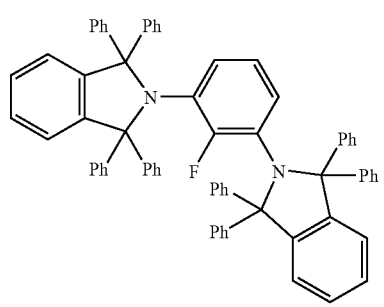
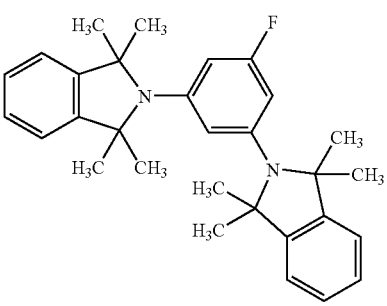
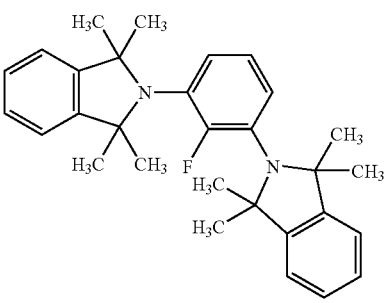
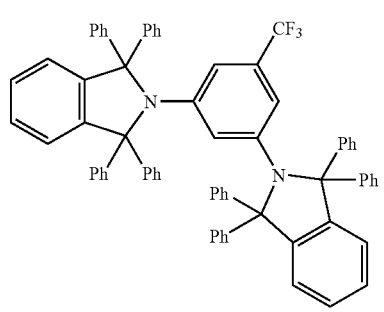
-continued
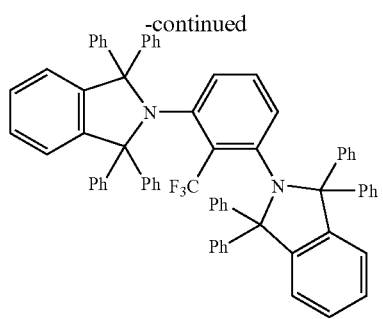
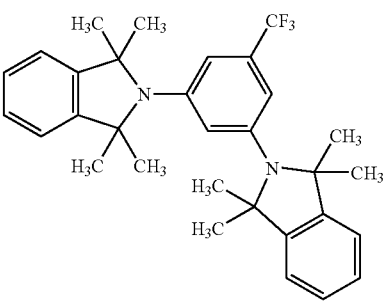
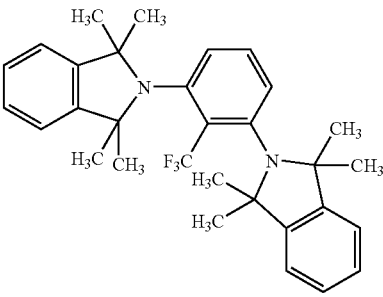
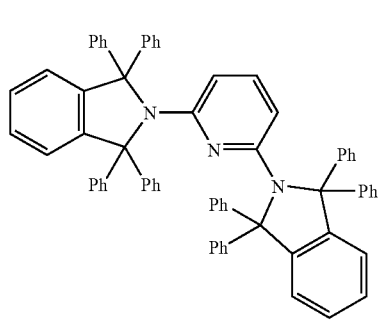
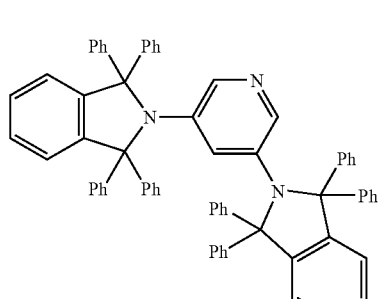

-continued
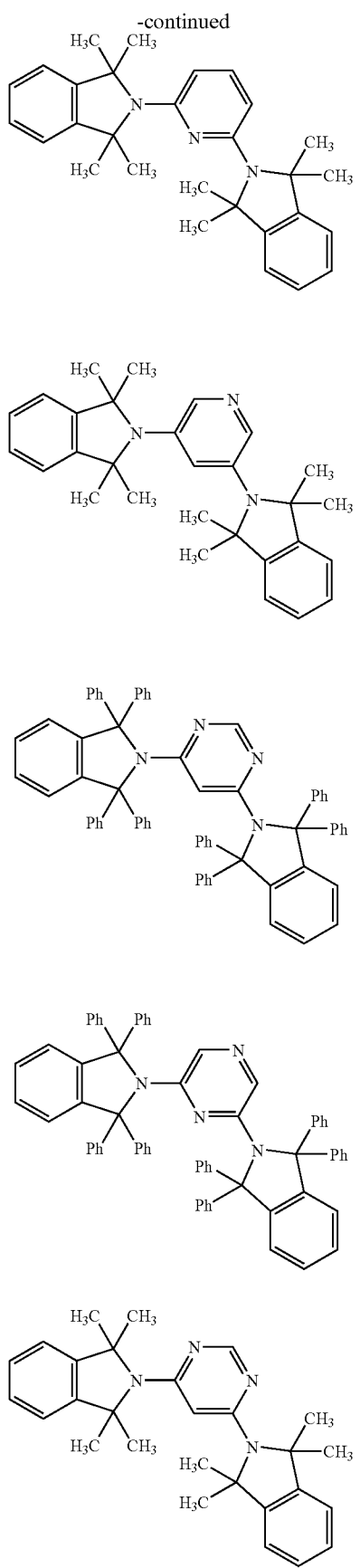
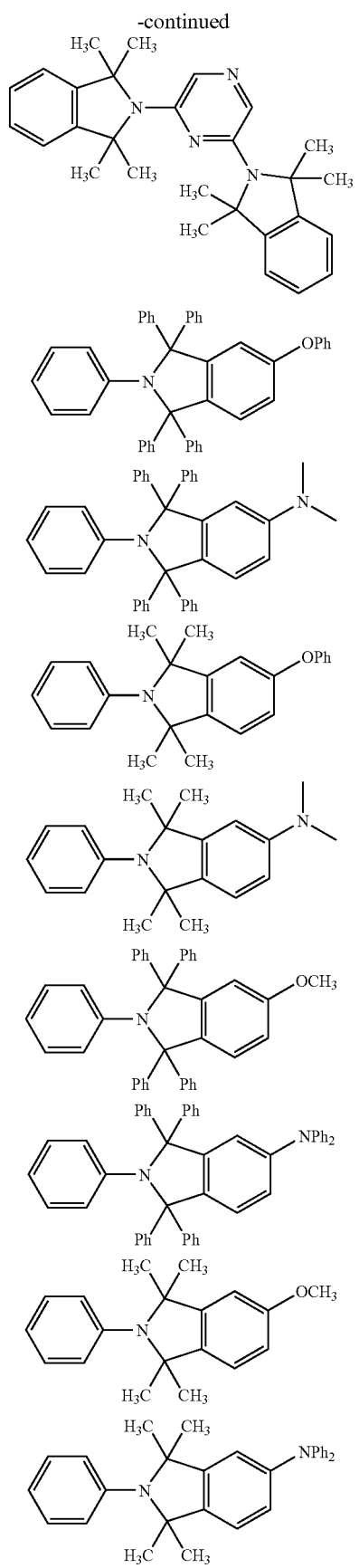

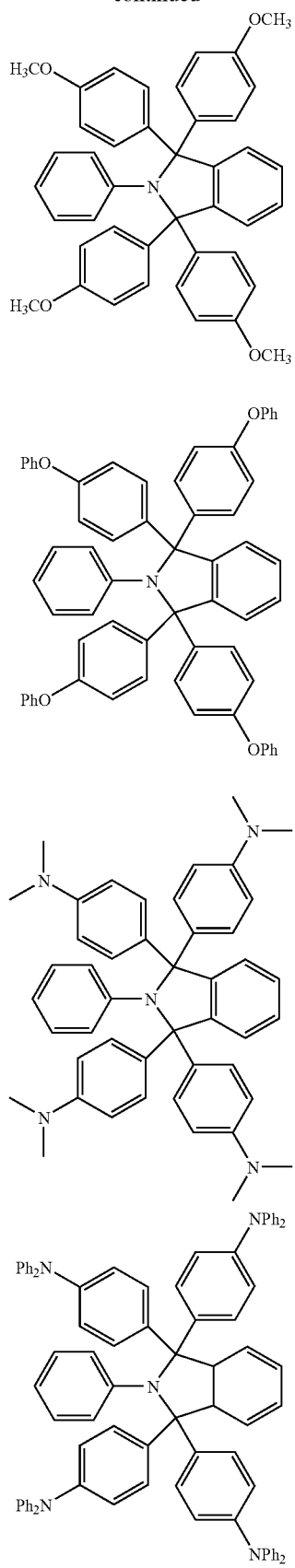

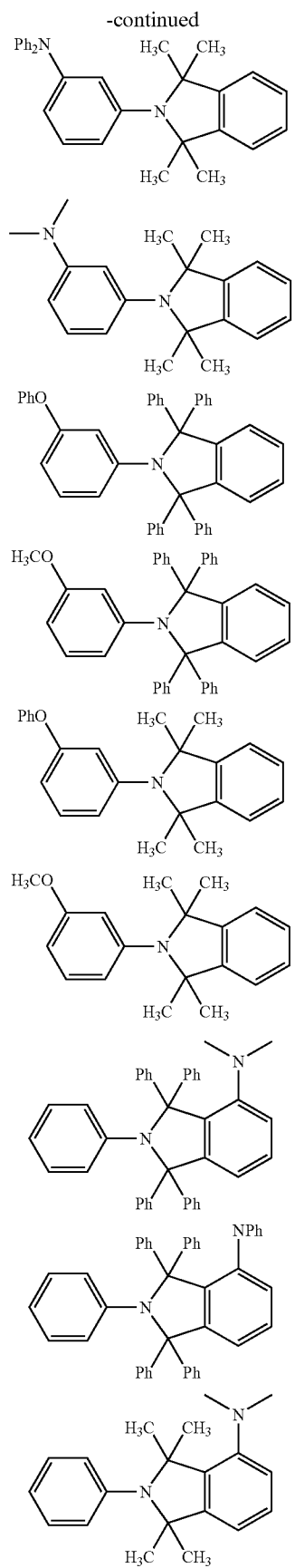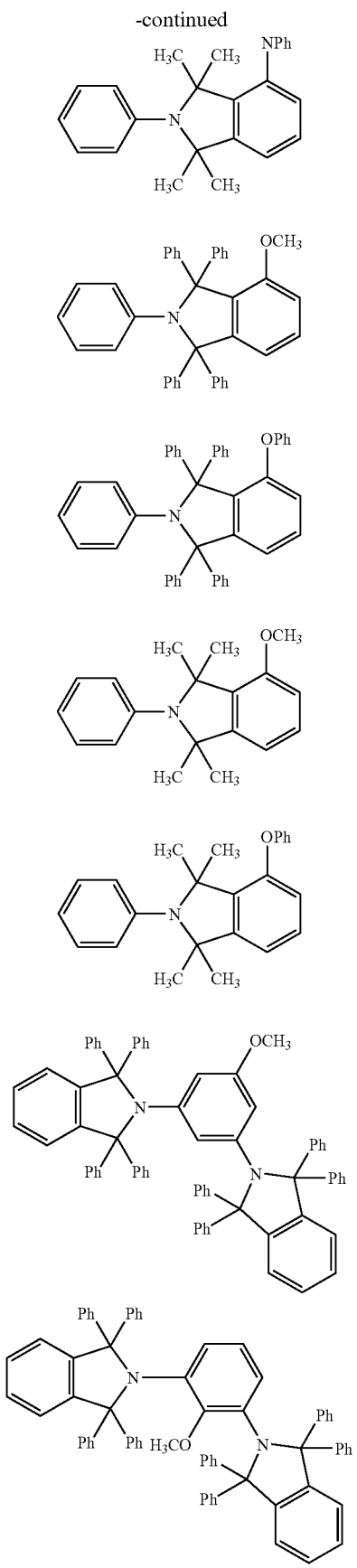

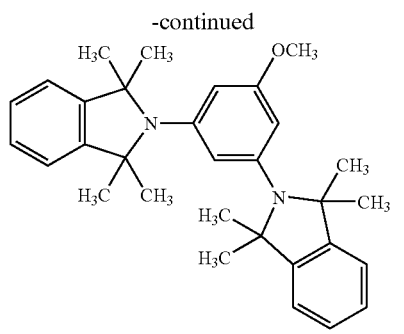

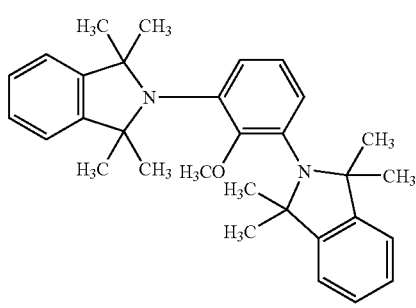

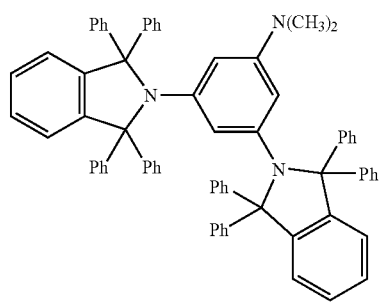

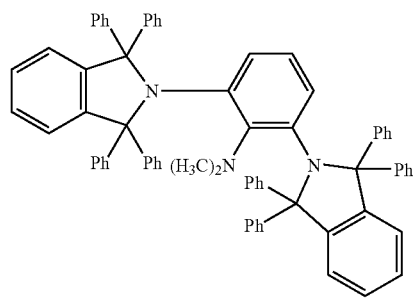

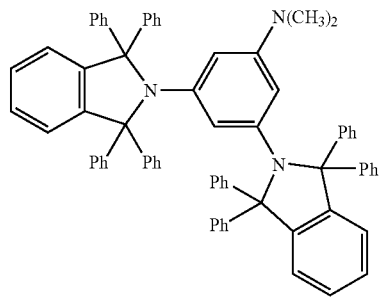

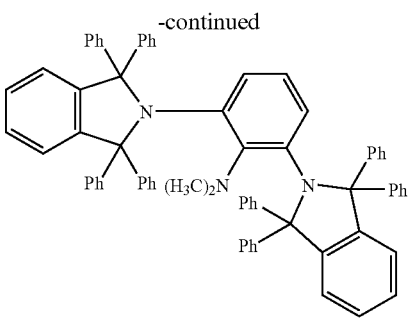

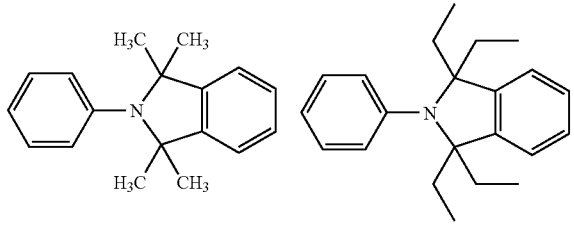

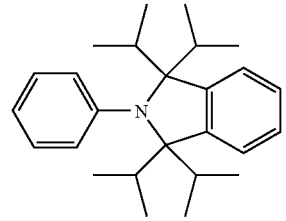

The compounds represented by formulae [1] to [3] can be synthesized using various known techniques (for example, the method described in *Journal Fuer Praktische Chemie*, 23, 59. (1964)). Other compounds may also be synthesized by referring to known techniques.

The organic electroluminescent device of the present invention preferably contains a phosphorescent material (e.g., iridium complex, platinum complex, rhenium complex, osmium complex, ruthenium complex. The phosphorescent material is preferably a metal complex having a tridentate or more multidentate ligand, more preferably a metal complex-based phosphorescent material having a tetradentate or more multidentate ligand, and still more preferably a platinum complex-based phosphorescent material having a tetradentate ligand.

Examples of the phosphorescent material include the compounds described in Japanese Patent Application Nos. 2004-088575, 2004-162849 (JP-A-2005-310733), 2005-069963 (JP-A-2005-317516), 2004-271064, 2005-041939, 2004-279153 (JP-A-2006-093542), 2005-075769, 2005-075341, 2005-070992 and 2005-075340 (phosphorescent materials, metal complexes (platinum complexes)).

The layer in which the compound represented by formula [1], [2] or [3] of the present invention is contained is not limited, but the compound is preferably contained in a hole injection layer, a hole transport layer, an electron blocking layer, a light-emitting layer, a hole blocking layer, an exciton blocking layer, an electron transport layer or an electron injection layer, more preferably in an electron blocking layer, a light-emitting layer, a hole blocking layer or an exciton blocking layer, still more preferably in a light-emitting layer or an electron blocking layer.

In the light-emitting layer, the compound represented by formula [1], [2] or [3] of the present invention may be used as a host material or a light-emitting material but is preferably used as a host material.

The host material is described below. Here, the host material is a material other than the light-emitting material among the materials constituting the light-emitting layer and means a material having at least one function out of a function of holding the dispersed light-emitting material in the layer, a function of receiving a hole from an anode, a hole transport layer or the like, a function of receiving an electron from a cathode, an electron transport layer or the like, a function of transporting a hole and/or an electron, a function of providing a site for recombination of a hole and an electron, a function of transferring the energy of an exciton produced by the recombination to the light-emitting material, and a function of transporting a hole and/or an electron to the light-emitting material.

In the case where the compound represented by formula [1], [2] or [3] of the present invention is contained as a host material in the light-emitting layer, the content thereof in the light-emitting layer is preferably from 5 to 99.5 mass %, more preferably from 30 to 95 mass %.

In the case of containing the compound in a layer other than the light-emitting layer, the content thereof in the layer is preferably from 50 to 100 mass %, more preferably from 70 to 100 mass %.

The $T_1$ level (energy level in a lowest triplet excited state) of the compound represented by formula [1], [2] or [3] of the present invention is preferably from 60 Kcal/mol (251.4 KJ/mol) to 90 Kcal/mol (377.1 KJ/mol), more preferably from 62 Kcal/mol (259.78 KJ/mol) to 85 Kcal/mol (356.15 KJ/mol), still more preferably from 65 Kcal/mol (272.35 KJ/mol) to 80 Kcal/mol (335.2 KJ/mol).

The ionization potential of the compound represented by formula [1], [2] or [3] of the present invention is preferably from 5.7 to 6.3 eV, more preferably from 5.75 to 6.2 eV, still more preferably from 5.8 to 6.0 eV.

The ionization potential of the host material can be measured, for example, by an in-air photoelectron spectrometer (AC-2, manufactured by Riken Keiki Co., Ltd.).

The organic electroluminescent device of the present invention preferably contains a metal complex-based material in the electron transport layer. The metal ion constituting the metal complex is not particularly limited but is preferably a divalent or trivalent metal ion, more preferably a trivalent aluminum ion, a divalent zinc ion, a trivalent gallium ion, a divalent beryllium ion or a divalent magnesium ion, still more preferably a trivalent aluminum ion, a trivalent gallium ion or a divalent zinc ion, yet still more preferably a trivalent aluminum ion.

By virtue of containing a metal complex-based material in the electron transport layer, the device driving voltage can be reduced and the device life can be prolonged.

The organic electroluminescent device of the present invention preferably contains two or more kinds of host materials in the light-emitting layer. As for the kind of the host material, two or more kinds are preferably selected from the compound represented by any one of formulae [1] to [3], a metal complex-based host material, an aromatic hydrocarbon-based host material and a nitrogen-containing organic material-based host material. More preferably, any one of a metal complex-based host material, an aromatic hydrocarbon-based host material and a nitrogen-containing organic material-based host material is contained in addition to the compound represented by any one of formulae [1] to [3].

When two or more kinds of host materials are contained in the light-emitting layer, this allows for reduced device driving voltage, prolonged device life and enhanced light emission efficiency.

The metal complex-based host material is described below.

The metal ion constituting the metal complex is not particularly limited but is preferably a divalent or trivalent metal ion, more preferably a trivalent aluminum ion, a divalent zinc ion, a trivalent gallium ion, a divalent beryllium ion or a divalent magnesium ion, still more preferably a trivalent aluminum ion, a trivalent gallium ion or a divalent zinc ion, yet still more preferably a trivalent aluminum ion.

The aromatic hydrocarbon-based host material is described below.

The aromatic hydrocarbon-based host material indicates an organic material composed of only carbon and hydrogen. The aromatic hydrocarbon-based host material is preferably free from a condensed ring structure such as naphthalene ring.

The nitrogen-containing organic material-based host material is described below.

The nitrogen-containing organic material-based host material indicates an organic compound having a nitrogen atoms, and examples thereof include an aniline derivative, a nitrogen-containing heterocyclic compound, and a metal complex having an aniline derivative or a nitrogen-containing heterocyclic compound in the ligand. The nitrogen-containing organic material is preferably a nitrogen-containing heterocyclic compound or a metal complex having such a compound in the ligand, more preferably a compound having a 5-membered nitrogen-containing heterocyclic ring (for example, a pyrrole ring, a pyrazole ring, an imidazole ring or a triazole ring, preferably a pyrrole ring or an imidazole ring, more preferably a pyrrole ring), still more preferably a compound having a 5-membered nitrogen-containing heterocyclic ring and a condensed ring structure with 6 rings.

The external quantum efficiency of the light-emitting device of the present invention is preferably 5% or more, more preferably 10% or more, still more preferably 13% or more. As for the numerical value of the external quantum efficiency, a maximum value of the external quantum efficiency when the device is driven at 20° C., or a value of the external quantum efficiency in the vicinity of 100 to 300 cd/m$^2$ when the device is driven at 20° C., can be used.

The internal quantum efficiency of the light-emitting device of the present invention is preferably 30% or more, more preferably 50% or more, still more preferably 70% or more. The internal quantum efficiency of the device is calculated by internal quantum efficiency=external quantum efficiency/light output efficiency. In the normal organic EL device, the light output efficiency is 20%, but the light out efficiency can be increased to 20% or more by designing the shape of substrate, the shape of electrode, the thickness of organic layer, the thickness of inorganic layer, the refractive index of organic layer, the refractive index of inorganic layer, or the like.

The light-emitting device of the present invention is preferably a device comprising at least three layers of a hole transport layer, a light-emitting layer and an electron transport layer.

The ionization potential of the host material contained in the light-emitting layer of the present invention is preferably from 5.7 to 6.3 eV, more preferably from 5.75 to 6.2 eV, still more preferably from 5.8 to 6.0 eV.

The ionization potential of the host material can be measured, for example, by an in-air photoelectron spectrometer (AC-2, manufactured by Riken Keiki Co., Ltd.).

The electron mobility of the host material in the light-emitting layer is preferably from $1\times10^{-6}$ to $1\times10^{-2}$ cm$^2$/Vs, more preferably from $5\times10^{-6}$ to $1\times10^{-2}$ cm$^2$/Vs, still more preferably from $1\times10^{-5}$ to $1\times10^{-2}$ cm$^2$/Vs, yet still more preferably from $5\times10^{-5}$ to $5\times10^{-3}$ cm$^2$/Vs.

The hole mobility of the host material in the light-emitting layer is preferably from $1\times10^{-6}$ to $1\times10^{-1}$ cm$^2$/Vs, more preferably from $5\times10^{-6}$ to $1\times10^{-2}$ cm$^2$/Vs, still more preferably from $1\times10^{-5}$ to $1\times10^{-2}$ cm$^2$/Vs, yet still more preferably from $5\times10^{-5}$ to $1\times10^{2}$ cm$^2$/Vs.

The host material contained in the light-emitting layer of the present invention, the electron transport layer and the hole transport material each preferably has a glass transition point of 90 to 400° C., more preferably from 100 to 380° C., still more preferably from 120 to 370° C., yet still more preferably from 140 to 360° C.

In the organic electroluminescent device of the present invention, in view of blue color purity, the emission peak wavelength is preferably from 390 to 495 nm, more preferably from 400 to 490 nm. The light-emitting device of the present invention may also have an emission peak wavelength at 500 nm or more and may be a white light-emitting device.

In the organic electroluminescent device of the present invention, in view of blue color purity, the x value of emitted light in CIE chromaticity coordinates is preferably 0.22 or less, more preferably 0.20 or less.

In the organic electroluminescent device of the present invention, in view of blue color purity, the y value of emitted light in CIE chromaticity coordinates is preferably 0.25 or less, more preferably 0.20 or less, still more preferably 0.15 or less.

In the organic electroluminescent device of the present invention, in view of blue color purity, the half-width of the emission spectrum is preferably 100 nm or less, more preferably 90 nm or less, still more preferably 80 nm or less, yet still more preferably 70 nm or less.

The $T_1$ level (energy level in a lowest triplet excited state) of the phosphorescent material is preferably from 60 Kcal/mol (251.4 KJ/mol) to 90 Kcal/mol (377.1 KJ/mol), more preferably from 62 Kcal/mol (259.78 KJ/mol) to 85 Kcal/mol (356.15 KJ/mol), still more preferably from 65 Kcal/mol (272.35 KJ/mol) to 80 Kcal/mol (335.2 KJ/mol).

The $T_1$ level (energy level in a lowest triplet excited state) of the host material in the light-emitting layer is preferably from 60 Kcal/mol (251.4 KJ/mol) to 90 Kcal/mol (377.1 KJ/mol), more preferably from 62 Kcal/mol (259.78 KJ/mol) to 85 Kcal/mol (356.15 KJ/mol), still more preferably from 65 Kcal/mol (272.35 KJ/mol) to 80 Kcal/mol (335.2 KJ/mol).

The $T_1$ level (energy level in a lowest triplet excited state) of a layer (e.g., hole transport layer, electron transport layer, charge blocking layer, exciton blocking layer) adjacent to the light-emitting layer is preferably from 60 Kcal/mol (251.4 KJ/mol) to 90 Kcal/mol (377.1 KJ/mol), more preferably from 62 Kcal/mol (259.78 KJ/mol) to 85 Kcal/mol (356.15 KJ/mol), still more preferably from 65 Kcal/mol (272.35 KJ/mol) to 80 Kcal/mol (335.2 KJ/mol).

The $T_1$ level (energy level in a lowest triplet excited state) of various materials such as phosphorescent material and host material can be calculated from the short wavelength end in the phosphorescent spectrum at 77K of the material film vacuum-deposited on a quartz glass plate.

[Organic Electroluminescent Device]

The organic electroluminescent device of the present invention is described in detail below.

The light-emitting device of the present invention has a cathode and an anode on a substrate and has, between these two electrodes, an organic layer (which may be a layer comprising only an organic compound or may be an organic layer containing an inorganic compound) including an organic light-emitting layer (hereinafter sometimes simply referred to as a "light-emitting layer"). Considering the property of the light-emitting device, at least one electrode out of the anode and the cathode is preferably transparent.

As for the embodiment of stacking in the organic layer of the present invention, an embodiment where a hole transport layer, a light-emitting layer and an electron transport layer are stacked in this order from the anode side is preferred. Furthermore, a charge blocking layer or the like may be present between the hole transport layer and the light-emitting layer or between the light-emitting layer and the electron transport layer. Also, a hole injection layer may be present between the anode and the hole transport layer, and an electron injection layer may be present between the cathode and the electron transport layer. Incidentally, each layer may be divided into a plurality of secondary layers.

The elements constituting the light-emitting material of the present invention are described in detail below.

<Substrate>

The substrate for use in the present invention is preferably a substrate which does not scatter or attenuate the light emitted from the organic layer. Specific examples thereof include an inorganic material such as yttrium-stabilized zirconia (YSZ) and glass, and an organic material such as polyester (e.g., polyethylene terephthalate, polybutylene phthalate, polyethylene naphthalate), polystyrene, polycarbonate, polyethersulfone, polyallylate, polyimide, polycycloolefin, norbornene resin and poly(chlorotrifluoroethylene).

For example, in the case of using glass as the substrate, the construction material used therefor is preferably non-alkali glass so as to reduce the ion dissolved out from the glass. Also, in the case of using soda lime glass, a barrier coat such as silica is preferably applied thereto before use. In the case of an organic material, those excellent in the heat resistance, dimensional stability, solvent resistance, electrical insulation and processability are preferred.

The shape, structure, size and the like of the substrate are not particularly limited and may be appropriately selected according to the usage, purpose or the like of the light-emitting device. In general, the substrate shape is preferably a plate form. The substrate structure may be a single-layer structure or a multilayer structure and may be formed of a single member or two or more members.

The substrate may be colorless and transparent or may be colored and transparent but from the standpoint that the light emitted from the organic light-emitting layer is free from scattering, attenuation or the like, the substrate is preferably colorless and transparent.

A moisture permeation-preventing layer (gas barrier layer) may be provided on the front or back surface of the substrate.

As for the material of the moisture permeation-preventing layer (gas barrier layer), an inorganic substance such as silicon nitride and silicon oxide is suitably used. The moisture permeation-preventing layer (gas barrier layer) can be formed, for example, by a high-frequency sputtering method.

In the case of using a thermoplastic substrate, a hardcoat layer, an undercoat layer and the like may be further provided, if desired.

<Anode>

The anode is usually sufficient if it has a function as an electrode of supplying a hole to the organic layer. The shape, structure, size and the like thereof are not particularly limited, and the anode material may be appropriately selected from known electrode materials according to the usage or purpose of the light-emitting device. The anode is usually provided as a transparent anode.

Suitable examples of the material for the anode include a metal, an alloy, a metal oxide, an electrically conducting compound and a mixture thereof. Specific examples of the anode material include an electrically conducting metal oxide such as tin oxide doped with antimony, fluorine or the like (ATO, FTO), tin oxide, zinc oxide, indium oxide, indium tin oxide (ITO) and indium zinc oxide (IZO); a metal such as gold, silver, chromium and nickel; a mixture or laminate of the metal and the electrically conducting metal oxide; an inorganic electrically conducting substance such as copper iodide and copper sulfide; an organic electrically conducting material such as polyaniline, polythiophene and polypyrrole; and a laminate of such a material and ITO. Among these, an electrically conducting metal oxide is preferred, and ITO is more preferred in view of productivity, high electrical conductivity, transparency and the like.

The anode can be formed on the substrate by a method appropriately selected, taking into consideration the suitability for the material constituting the anode, from a wet system such as printing and coating, a physical system such as vacuum deposition, sputtering and ion plating, and a chemical system such as CVD and plasma CVD. For example, in the case of selecting ITO as the anode material, the anode may be formed by a DC or high-frequency sputtering method, a vacuum deposition method or an ion plating method.

In the organic electroluminescent device of the present invention, the position where the anode is formed is not particularly limited and may be appropriately selected according to the usage or purpose of the light-emitting device, but the anode is preferably formed on the substrate. In this case, the anode may be formed entirely or partially on one surface of the substrate.

The patterning when forming the anode may be performed by chemical etching using photolithography or the like, by physical etching using a laser or the like, by vacuum deposition or sputtering using a mask, or by a lift-off method or printing method.

The thickness of the anode may be appropriately selected according to the material constituting the anode and cannot be indiscriminately specified but is usually on the order of 10 nm to 50 μm, preferably from 50 nm to 20 μm.

The resistance value of the anode is preferably $10^3$ Ω/square or less, more preferably 10 Ω/square or less. In the case where the anode is transparent, the anode may be colorless and transparent or may be colored and transparent. In order to output the emitted light from the transparent anode side, the transmittance of the anode is preferably 60% or more, more preferably 70% or more.

Incidentally, the transparent anode is described in detail in Yutaka Sawada (supervisor), *Tomei Denkyoku Maku no Shin-Tenkai* (*New Development of Transparent Electrode Film*, CMC (1999), and the matters described therein can be applied in the present invention. In the case of employing a plastic substrate having low heat resistance, a transparent anode film-formed using ITO or IZO at a low temperature of 150° C. or less is preferred.

<Cathode>

The cathode is usually sufficient if it has a function as an electrode of injecting an electron in the organic layer. The shape, structure, size and the like thereof are not particularly limited, and the cathode material may be appropriately selected from known electrode materials according to the usage or purpose of the light-emitting device.

Examples of the material constituting the cathode include a metal, an alloy, a metal oxide, an electrically conducting compound and a mixture thereof. Specific examples thereof include an alkali metal (e.g., Li, Na, K, Cs), an alkaline earth metal (e.g., Mg, Ca), gold, silver, lead, aluminum, a sodium-potassium alloy, a lithium-aluminum alloy, a magnesium-silver alloy, and a rare earth metal such as indium and ytterbium. One of these materials may be used alone, but in view of satisfying both stability and electron-injecting property, two or more kinds may be suitably used in combination.

Among these materials for constituting the cathode, an alkali metal and an alkaline earth metal are preferred in view of electron-injecting property, and a material mainly comprising aluminum is preferred in view of excellent storage stability.

The "material mainly comprising aluminum" indicates aluminum alone or an alloy or mixture of aluminum with 0.01 to 10 mass % of an alkali metal or alkaline earth metal (for example, a lithium-aluminum alloy and a magnesium-aluminum alloy).

Incidentally, the cathode material is described in detail in JP-A-2-15595 and JP-A-5-121172, and the materials described therein can be applied also in the present invention.

The method for forming the cathode is not particularly limited, and the cathode may be formed according to known methods. For example, the cathode may be formed by a method appropriately selected, taking into consideration the suitability for the material constituting the cathode, from a wet system such as printing and coating, a physical system such as vacuum deposition, sputtering and ion plating, and a chemical system such as CVD and plasma CVD. For example, in the case of selecting a metal or the like as the cathode material, one species or two or more species thereof may be sputtered simultaneously or sequentially.

The patterning when forming the cathode may be performed by chemical etching using photolithography or the like, by physical etching using a laser or the like, by vacuum deposition or sputtering using a mask, or by a lift-off method or printing method.

In the present invention, the position where the cathode is formed is not particularly limited, and the cathode may be formed entirely or partially on the organic layer.

A dielectric layer comprising a fluoride, oxide or the like of an alkali metal or alkaline earth metal may be inserted between the cathode and the organic layer to have a thickness of 0.1 to 5 nm. This dielectric layer may be regarded as a kind of an electron injection layer. The dielectric layer can be formed, for example, by a vacuum deposition method, a sputtering method or an ion plating method.

The thickness of the cathode may be appropriately selected according to the material constituting the cathode and cannot be indiscriminately specified but is usually on the order of 10 nm to 5 μm, preferably from 50 nm to 1 μm.

The cathode may be transparent or opaque. The transparent cathode may be formed by film-forming the cathode material to a small thickness of 1 to 10 nm and further stacking thereon a transparent electrically conducting material such as ITO and IZO.

<Organic Layer>

The organic layer for use in the present invention is described below.

The organic electroluminescent device of the present invention has at least one organic layer including a light-emitting layer, and the organic layer other than the organic light-emitting layer includes, as described above, layers such as hole transport layer, electron transport layer, charge blocking layer, hole injection layer and electron injection layer.

—Formation of Organic Layer—

In the organic electroluminescent device of the present invention, the layers constituting the organic compound layer each may be suitably formed by any method such as dry film-forming method (e.g., vapor deposition, sputtering), transfer method and printing method.

—Organic Light-Emitting Layer—

The organic light-emitting layer is a layer having a function of, when an electric field is applied, receiving a hole from the anode, hole injection layer or hole transport layer, receiving an electron from the cathode, electron injection layer or electron transport layer, and providing a site for recombination of a hole and an electron, thereby emitting light.

In the present invention, the light-emitting layer may be composed of only a light-emitting material or may have a mixed layer structure of a host material and a light-emitting material. The light-emitting material may be either a fluorescent material or a phosphorescent material and as for the dopant, one species or two or more species may be used. The host material is preferably a charge transport material. As for the host material, one species or two or more species may be used, and examples thereof include a construction of mixing an electron-transporting host material and a hole-transporting host material. Also, the light-emitting layer may contain a material which does not have electron transport property and does not emit light.

Furthermore, the light-emitting layer may be composed of one layer or two or more layers, and the layers may differ in the color of light emitted.

Examples of the fluorescent material which can be used in the present invention include a benzoxazole derivative, a benzimidazole derivative, a benzothiazole derivative, a styrylbenzene derivative, a polyphenyl derivative, a diphenylbutadiene derivative, a tetraphenylbutadiene derivative, a naphthalimide derivative, a coumarin derivative, a condensed aromatic compound, a perynone derivative, an oxadiazole derivative, an oxazine derivative, an aldazine derivative, a pyralidine derivative, a cyclopentadiene derivative, a bis-styrylanthracene derivative, a quinacridone derivative, a pyrrolopyridine derivative, a thiadiazolopyridine derivative, a cyclopentadiene derivative, a styrylamine derivative, a diketopyrrolopyrrole derivative, an aromatic dimethylidine compound, various metal complexes as represented by a metal complex of 8-quinolinol derivative and a metal complex of pyrromethene derivative, a polymer compound such as polythiophene, polyphenylene and polyphenylenevinylene, and a compound such as organic silane derivative.

Examples of the phosphorescent material which can be used in the present invention include a complex containing a transition metal atom or a lanthanoid atom.

The transition metal atom is not particularly limited, but preferred examples thereof include ruthenium, rhodium, palladium, tungsten, rhenium, osmium, iridium and platinum, with rhenium, iridium and platinum being more preferred.

Examples of the lanthanoid atom include lanthanum, cerium, praseodymium, neodymium, samarium, europium, gadolinium, terbium, dysprosium, holmium, erbium, thulium, ytterbium and lutetium. Among these lanthanoid atoms, neodymium, europium and gadolinium are preferred.

Examples of the ligand of the complex include the ligands described in G. Wilkinson et al., *Comprehensive Coordination Chemistry*, Pergamon Press (1987), H. Yersin, *Photochemistry and Photophysics of Coordination Compounds*, Springer-Verlag (1987), and Akio Yamamoto, *Yuki Kinzoku Kagaku—Kiso to Oyo—(Metalorganic Chemistry—Foundation and Application—)*, Shokabo (1982).

Specifically, the ligand is preferably a halogen ligand (preferably chlorine ligand), a nitrogen-containing heterocyclic ligand (e.g., phenylpyridine, benzoquinoline, quinolinol, bipyridyl, phenanthroline), a diketone ligand (e.g., acetylacetone), a carboxylic acid ligand (e.g., acetic acid ligand), a carbon monoxide ligand, an isonitrile ligand or a cyano ligand, more preferably a nitrogen-containing heterocyclic ligand. The complex may have one transition metal atom in the compound or may be a so-called binuclear complex having two or more transition metal atoms. Different kinds of metal atoms may be contained at the same time.

The phosphorescent material is preferably contained in the light-emitting layer in an amount of 0.1 to 40 mass %, more preferably from 0.5 to 20 mass %.

Examples of the host material contained in the light-emitting layer of the present invention include materials having a carbazole skeleton, a diarylamine skeleton, a pyridine skeleton, a pyrazine skeleton, a triazine skeleton or an arylsilane skeleton, and the materials described later in the paragraphs of hole injection layer, hole transport layer, electron injection layer and electron transport layer.

The thickness of the light-emitting layer is not particularly limited but usually, the thickness is preferably from 1 to 500 nm, more preferably from 5 to 200 nm, still more preferably from 10 to 100 nm.

—Hole Injection Layer, Hole Transport Layer—

The hole injection layer and hole transport layer are a layer having a function of receiving a hole from the anode or anode side and transporting it to the cathode side. Specifically, the hole injection layer and hole transport layer each is preferably a layer containing, for example, a carbazole derivative, a triazole derivative, an oxazole derivative, an oxadiazole derivative, an imidazole derivative, a polyarylalkane derivative, a pyrazoline derivative, a pyrazolone derivative, a phenylenediamine derivative, an arylamine derivative, an amino-substituted chalcone derivative, a styrylanthracene derivative, a fluorenone derivative, a hydrazone derivative, a stilbene derivative, a silazane derivative, an aromatic tertiary amine compound, a styrylamine compound, an aromatic dimethylidyne-based compound, a porphyrin-based compound, an organic silane compound, carbon, or a metal complex of various types as represented by an Ir complex having phenylazole or phenylazine as a ligand.

The thickness of each of the hole injection layer and the hole transport layer is preferably 500 nm or less from the standpoint of lowering the driving voltage.

The thickness of the hole transport layer is preferably from 1 to 500 nm, more preferably from 5 to 200 nm, still more preferably from 10 to 100 nm, and the thickness of the hole injection layer is preferably from 0.1 to 200 nm, more preferably from 0.5 to 100 nm, still more preferably from 1 to 100 nm.

The hole injection layer and hole transport layer each may have a single-layer structure comprising one species or two or more species of the above-described materials or may have a multilayer structure comprising a plurality of layers having the same composition or different compositions.

—Electron Injection Layer, Electron Transport Layer—

The electron injection layer and electron transport layer are a layer having a function of receiving an electron from the cathode or cathode side and transporting it to the anode side. Specifically, the electron injection layer and electron transport layer each is preferably a layer containing, for example, a triazole derivative, an oxazole derivative, an oxadiazole derivative, an imidazole derivative, a fluorenone derivative, an anthraquinodimethane derivative, an anthrone derivative, a diphenylquinone derivative, a thiopyran dioxide derivative, a carbodiimide derivative, a fluorenylidenemethane derivative, a distyrylpyrazine derivative, an aromatic ring tetracarboxylic acid anhydride such as naphthalene and perylene, a phthalocyanine derivative, a metal complex of various types as represented by a metal complex of 8-quinolinol derivative and a metal complex having metal phthalocyanine, benzoxazole or benzothiazole in the ligand, or an organic silane derivative.

The thickness of each of the electron injection layer and the electron transport layer is preferably 500 nm or less from the standpoint of lowering the driving voltage.

The thickness of the electron transport layer is preferably from 1 to 500 nm, more preferably from 5 to 200 nm, still more preferably from 10 to 100 nm, and the thickness of the electron injection layer is preferably from 0.1 to 200 nm, more preferably from 0.2 to 100 nm, still more preferably from 0.5 to 50 nm.

The electron injection layer and electron transport layer each may have a single-layer structure comprising one species or two or more species of the above-described materials or may have a multilayer structure comprising a plurality of layers having the same composition or different compositions.

—Hole Blocking Layer—

The hole blocking layer is a layer having a function of not allowing a hole transported to the light-emitting layer from the anode side to penetrate to the cathode side. In the present invention, the hole blocking layer may be provided as an organic compound layer adjacent to the light-emitting layer on the cathode side.

Examples of the organic compound constituting the hole blocking layer include an aluminum complex such as BAlq, a triazole derivative, and a phenanthroline derivative such as BCP.

The thickness of the hole blocking layer is preferably from 1 to 500 nm, more preferably from 5 to 200 nm, still more preferably from 10 to 100 nm.

The hole blocking layer may have a single-layer structure comprising one species or two or more species of the above-described materials or may have a multilayer structure comprising a plurality of layers having the same composition or different compositions.

<Protective Layer>

In the present invention, the entire organic EL device may be protected by a protective layer.

The material contained in the protective layer may be sufficient if it has a function of preventing a device deterioration promoter such as moisture and oxygen from intruding into the device.

Specific examples thereof include a metal such as In, Sn, Pb, Au, Cu, Ag, Al, Ti and Ni, a metal oxide such as MgO, SiO, $SiO_2$, $Al_2O_3$, GeO, NiO, CaO, BaO, $Fe_2O_3$, $Y_2O_3$ and $TiO_2$, a metal nitride such as $SiN_x$ and $SiN_xO_y$, a metal fluoride such as $MgF_2$, LiF, $AlF_3$ and $CaF_2$, polyethylene, polypropylene, polymethyl methacrylate, polyimide, polyurea, polytetrafluoroethylene, polychlorotrifluoroethylene, polydichlorodifluoroethylene, a copolymer of chlorotrifluoroethylene and dichlorodifluoroethylene, a copolymer obtained by copolymerizing a monomer mixture containing tetrafluoroethylene and at least one comonomer, a fluorine-containing copolymer having a cyclic structure in the copolymer main chain, a water-absorbing substance having a water absorption percentage of 1% or more, and a moisture-proof substance having a water absorption percentage of 0.1% or less.

The method for forming the protective layer is not particularly limited, and examples of the method which can be applied include a vacuum deposition method, a sputtering method, a reactive sputtering method, an MBE (molecular beam epitaxy) method, a cluster ion beam method, an ion plating method, a plasma polymerization method (high-frequency excitation ion plating method), a plasma CVD method, a laser CVD method, a thermal CVD method, a gas source CVD method, a coating method, a printing method and a transfer method.

<Encapsulation>

The organic electroluminescent device of the present invention may be subjected to encapsulation of the entire device by using a sealing container.

Also, a moisture absorbent or an inactive liquid may be enclosed in the space between the sealing container and the light-emitting device. The moisture absorbent is not particularly limited, but examples thereof include barium oxide, sodium oxide, potassium oxide, calcium oxide, sodium sulfate, calcium sulfate, magnesium sulfate, phosphorus pentoxide, calcium chloride, magnesium chloride, copper chloride, cesium fluoride, niobium fluoride, calcium bromide, vanadium bromide, molecular sieve, zeolite and magnesium oxide. The inactive liquid is not particularly limited, but examples thereof include paraffins, liquid paraffins, a fluorine-based solvent such as perfluoroalkane, perfluoroamine and perfluoroether, a chlorine-based solvent and silicone oils.

In the organic electroluminescent device of the present invention, a DC (if desired, may contain an AC component) voltage (usually from 2 to 15 V) or a DC current is passed between the anode and the cathode, whereby light emission can be obtained.

As for the driving method of the organic electro-luminescent device of the present invention, the driving methods described, for example, in JP-A-2-148687, JP-A-6-301355, JP-A-5-29080, JP-A-7-134558, JP-A-8-234685, JP-A-8-241047, Japanese Patent 2,784,615, and U.S. Pat. Nos. 5,828,429 and 6,023,308 may be applied.

EXAMPLES

The present invention is described in detail below by referring to Examples, but the embodiment of the present invention is not limited thereto.

Synthesis Example 1

Compound (5-1) was synthesized according to the technique described in *Journal Fuer Praktische Chemie*, 23, 59. (1964). The crude material obtained was purified by sublimation to obtain Compound (5-1).

Synthesis Example 2

Compound (5-4) was synthesized according to the technique described in *Journal Fuer Praktische Chemie*, 23, 59. (1964). The crude material obtained was purified by sublimation to obtain Compound (5-4).

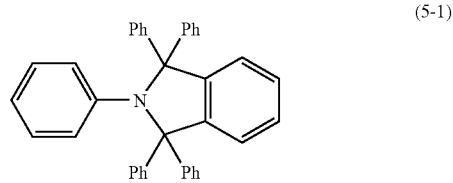

-continued

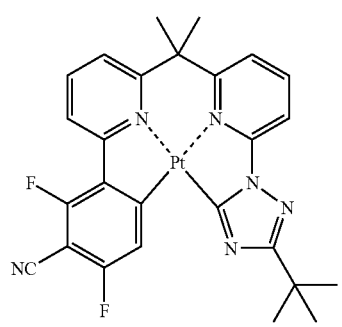

(5-2)

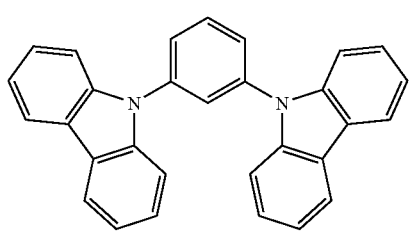

(5-3)

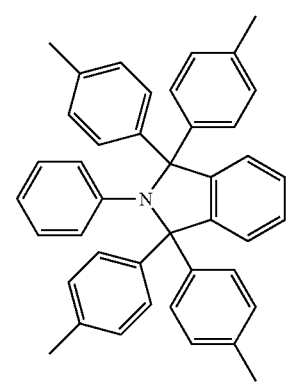

(5-4)

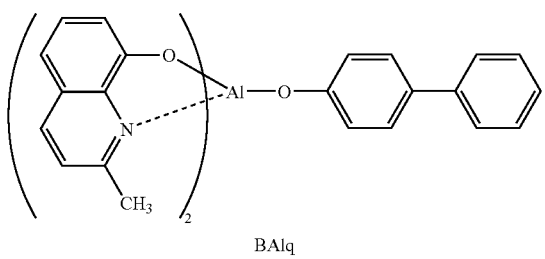

BAlq

Reference Example 1

The $T_1$ level of the Compound (5-1) film was measured. The phosphorescent spectrum was measured at 77K and the $T_1$ level was calculated from the short wavelength end in the spectrum. The $T_1$ level of the Compound (5-1) film produced on a quartz glass plate by vacuum deposition was 73 Kcal/mol (306.9 KJ/mol). Also, the $T_1$ level of the mCP vapor-deposited film produced in the same manner was measured and found to be 69 Kcal/mol (277.5 KJ/mol). It is seen that the compound represented by formula [1] has a high $T_1$ level as compared with mCP and when used in combination with a pure blue phosphorescent material having a $T_1$ level of 65 kcal/mol or more, non-radiation deactivation can be prevented to enable high-efficiency light emission in principle.

Reference Example 2

The ionization potential of the compound (5-1) film produced in the same manner as in Reference Example 1 was measured by an in-air photoelectron spectrometer (AC-2, manufactured by Riken Keiki Co., Ltd.). The measured vale was 5.8 eV and is small as compared with the ionization potential value (6.0 eV) of mCP. Accordingly, this compound can be said to be a material excellent in the hole injecting property and hole transporting property in principle for mCP. That is, when this compound is used as a host material in a light-emitting device, non-radiation deactivation can be prevented to enable high-efficiency light emission and by virtue of excellent hole injecting property/hole transporting property, reduction in the driving voltage can be realized.

Comparative Example 1

A cleaned ITO substrate was placed in a vapor deposition apparatus and copper phthalocyanine was vapor-deposited thereon to a thickness of 10 nm. Furthermore, NPD (N,N'-di-α-naphthyl-N,N'-diphenyl)-benzidine) was vapor-deposited thereon to a thickness of 40 nm, Platinum Complex (5-2) and mCP (5-3) were vapor-deposited thereon to a thickness of 20 nm at a ratio of 10:90 (by mass), BAlq was vapor-deposited thereon to a thickness of 6 nm, Alq (tris(8-hydroxyquinoline) aluminum complex) was vapor-deposited thereon to a thickness of 20 nm, lithium fluoride was vapor-deposited thereon to a thickness of 3 nm, and aluminum was then vapor-deposited to a thickness of 60 nm, thereby producing a device. When light was emitted by applying a constant DC voltage to the EL device from a source measure unit, Model 2400, manufactured by Toyo Corp., phosphorescence derived from Platinum Complex (5-2) was obtained.

Example 1

A cleaned ITO substrate was placed in a vapor deposition apparatus and copper phthalocyanine was vapor-deposited thereon to a thickness of 10 nm. Furthermore, NPD (N,N'-di-α-naphthyl-N,N'-diphenyl)-benzidine) was vapor-deposited thereon to a thickness of 40 nm, Platinum Complex (5-2) ($T_1$ level: 65 kcal/mol) and Compound (5-1) were vapor-deposited thereon to a thickness of 20 nm at a ratio of 10:90 (by mass), BAlq was vapor-deposited thereon to a thickness of 6 nm, Alq (tris(8-hydroxyquinoline)aluminum complex) was vapor-deposited thereon to a thickness of 20 nm, lithium fluoride was vapor-deposited thereon to a thickness of 3 nm, and aluminum was then vapor-deposited to a thickness of 60 nm, thereby producing a device. When light was emitted by applying a constant DC voltage to the EL device from a source measure unit, Model 2400, manufactured by Toyo Corp., phosphorescence derived from Platinum Complex (5-2) was obtained. The brightness efficiency of the obtained light emission at 10 Cd/m² was 1.2 times that in Comparative Example 1.

Example 2

A cleaned ITO substrate was placed in a vapor deposition apparatus and copper phthalocyanine was vapor-deposited hereon to a thickness of 10 nm. Furthermore, NPD (N,N'-di-α-naphthyl-N,N'-diphenyl)-benzidine) was vapor-deposited thereon to a thickness of 40 nm, Compound (5-4) was vapor-deposited thereon to a thickness of 3 nm, Platinum Complex (5-2) and mCP (5-3) were vapor-deposited thereon to a thickness of 20 nm at a ratio of 10:90 (by mass), BAlq was vapor-deposited thereon to a thickness of 6 nm, Alq (tris(8-hydroxyquinoline)aluminum complex) was vapor-deposited thereon to a thickness of 20 nm, lithium fluoride was vapor-deposited thereon to a thickness of 3 nm, and aluminum was then vapor-deposited to a thickness of 60 nm, thereby producing a device. When light was emitted by applying a constant DC voltage to the EL device from a source measure unit, Model 2400, manufactured by Toyo Corp., phosphorescence derived from Platinum Complex (5-2) was obtained. The brightness efficiency of the obtained light emission at 10 Cd/m² was 1.1 times that in Comparative Example 1.

Example 3

A cleaned ITO substrate was placed in a vapor deposition apparatus and copper phthalocyanine was vapor-deposited thereon to a thickness of 10 nm. Furthermore, NPD (N,N'-di-α-naphthyl-N,N'-diphenyl)-benzidine) was vapor-deposited thereon to a thickness of 40 nm, Compound (5-1) was vapor-deposited thereon to a thickness of 1 nm, Platinum Complex (5-2) and Compound (5-1) were vapor-deposited thereon to a thickness of 20 nm at a ratio of 10:90 (by mass), BAlq was vapor-deposited thereon to a thickness of 6 nm, Alq (tris(8-hydroxyquinoline)aluminum complex) was vapor-deposited thereon to a thickness of 20 nm, lithium fluoride was vapor-deposited thereon to a thickness of 3 nm, and aluminum was then vapor-deposited to a thickness of 60 nm, thereby producing a device. When light was emitted by applying a constant DC voltage to the EL device from a source measure unit, Model 2400, manufactured by Toyo Corp., phosphorescence derived from Platinum Complex (5-2) was obtained. The brightness efficiency of the obtained light emission at 10 Cd/m² was 1.15 times that in Comparative Example 1.

Example 4

A cleaned ITO substrate was placed in a vapor deposition apparatus and copper phthalocyanine was vapor-deposited thereon to a thickness of 10 nm. Furthermore, NPD (N,N'-di-α-naphthyl-N,N'-diphenyl)-benzidine) was vapor-deposited thereon to a thickness of 40 nm, Platinum Complex (5-2), Compound (5-4) and mCP (5-3) were vapor-deposited thereon to a thickness of 20 nm at a ratio of 10:5:85 (by mass), BAlq was vapor-deposited thereon to a thickness of 6 nm, Alq (tris(8-hydroxyquinoline)aluminum complex) was vapor-deposited thereon to a thickness of 20 nm, lithium fluoride was vapor-deposited thereon to a thickness of 3 nm, and aluminum was then vapor-deposited to a thickness of 60 nm, thereby producing a device. When light was emitted by applying a constant DC voltage to the EL device from a source measure unit, Model 2400, manufactured by Toyo Corp., phosphorescence derived from Platinum Complex (5-2) was obtained. The brightness efficiency of the obtained light emission at 10 Cd/m² was 1.05 times that in Comparative Example 1.

The compounds represented by formulae [1] to [3] of the present invention have a high $T_1$ level (energy level in a lowest triplet excited state) and a low ionization potential value (Ip value), so that even when a light emitting device is produced by combining such a compound with a light-emitting material having a high $T_1$ level, non-radiation deactivation can be made to less occur and a device driving voltage can be realized.

The entire disclosure of each and every foreign patent application from which the benefit of foreign priority has been claimed in the present application is incorporated herein by reference, as if fully set forth.

What is claimed is:

1. An organic electroluminescent device comprising:
    a pair of electrodes; and
    at least one organic layer comprising a light-emitting layer, said at least one organic layer being between the electrodes,
    wherein at least one of said at least one organic layer comprises at least one kind of compound represented by formula [1]:

Formula [1]:

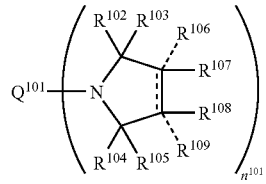

wherein $Q^{101}$ represents a linking group, the bond between the carbon atom bonded by $R^{107}$ and the carbon atom bonded by $R^{108}$ may be a single bond or a double bond (provided that when the bond between the carbon atom bonded by $R^{107}$ and the carbon atom bonded by $R^{108}$ is a double bond, $R^{106}$ and $R^{109}$ are not present), $R^{102}$ to $R^{105}$ each represents a substituent, $R^{106}$ to $R^{109}$ each represents a hydrogen atom or a substituent, $R^{107}$ and $R^{108}$ may combine to form a condensed ring, and $n^{101}$ represents an integer of 1 to 6.

2. The organic electroluminescent device as claimed in claim 1,
    wherein the compound represented by formula [1] is a compound represented by formula [2]:

Formula [2]:

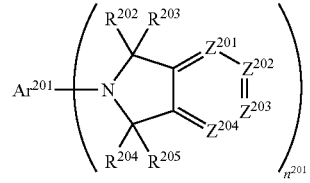

wherein $Ar^{201}$ represents an aryl linking group or a heteroaryl linking group, $R^{202}$ to $R^{205}$ each represents a substituent, $Z^{201}$ to $Z^{204}$ each represents a nitrogen atom or a substituted or unsubstituted (the "unsubstituted" is defined as being substituted by a hydrogen atom) carbon atom, and $n^{201}$ represents an integer of 1 to 6.

3. The organic electroluminescent device as claimed in claim 1,
    wherein the compound represented by formula [1] is a compound represented by formula [3]:

Formula [3]:

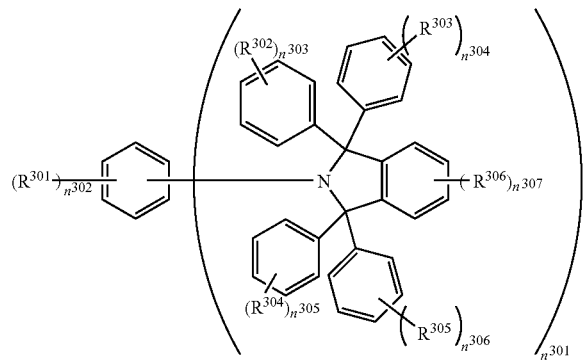

wherein $R^{301}$ to $R^{306}$ each represents a substituent, $n^{301}$ represents an integer of 1 to 6, $n^{302}$ represents an integer of 0 to $(6-n^{301})$, $n^{303}$, $n^{304}$, $n^{305}$ and $n^{306}$ each represents an integer of 0 to 5, and $n^{307}$ represents an integer of 0 to 4.

4. The organic electroluminescent device as claimed in claim 1, wherein the light-emitting layer comprises at least one kind of a phosphorescent material.

5. The organic electroluminescent device as claimed in claim 1, wherein the light-emitting layer comprises the compound represented by formula [1].

6. The organic electroluminescent device as claimed in claim 1, wherein at least one of one or more layers adjacent to the light-emitting layer comprises the compound represented by formula [1].

7. The organic electroluminescent device as claimed in claim 1, further comprising an electron transport layer that contains a metal complex-based material.

8. The organic electroluminescent device as claimed in claim 1, wherein the light-emitting layer comprises two or more kinds of host materials.

* * * * *